(12) United States Patent
Kawasumi

(10) Patent No.: US 6,366,492 B1
(45) Date of Patent: Apr. 2, 2002

(54) SEMICONDUCTOR MEMORY DEVICE CAPABLE OF AUTOMATICALLY CONTROLLING BIT-LINE RECOVERY OPERATION

(75) Inventor: Atsushi Kawasumi, Kanagawa-ken (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 09/595,118

(22) Filed: Jun. 16, 2000

(30) Foreign Application Priority Data

Jun. 18, 1999 (JP) .......................................... 11-173218

(51) Int. Cl.[7] .............................................. G11C 11/00
(52) U.S. Cl. ....................................... 365/154; 365/156
(58) Field of Search ................................ 365/154, 156, 365/203, 129, 189.01

(56) References Cited

U.S. PATENT DOCUMENTS 4,586,166 A    4/1986  Shah
4,951,252 A  *  8/1990  White et al. ........... 365/189.11
5,828,614 A  * 10/1998  Gradinariu ................... 365/208
5,966,319 A  * 10/1999  Sato ........................... 365/154

* cited by examiner

Primary Examiner—Hoai V. Ho
(74) Attorney, Agent, or Firm—Banner & Witcoff, Ltd.

(57) ABSTRACT

A SRAM includes a memory cell array (1), a write-in driver (3), a sense amplifier (2), and bit line loads (4 and 4'). The write-in driver (3) transfers write-in data to the bit lines BL and bBL, and supplies a high voltage potential to the bit lines BL and bBL when the voltage potential of the bit lines BL and bBL drops to a low voltage potential in order to increase the voltage potential to a high voltage potential. The sense amplifier (2) detects data read out from the memory cells and amplifies the data. The bit line loads (4 and 4') which are located at ends of the bit lines BL and bBL. The ON/OFF operation of the bit line loads (4 and 4') is controlled automatically according to the voltage potential of the bit lines BL and bBL. Each bit line load (4 or 4') has a PMOS transistor (QP1 or QP2) located between the bit line (BL or bBL) and a power source Vcc, and an inverter I4 for inverting the voltage potential of the bit line (Bl or bBL) and provides the inverted voltage potential to the gate of the PMOS transistor (QP1 or QP2).

12 Claims, 8 Drawing Sheets

SEMICONDUCTOR MEMORY DEVICE CAPABLE OF AUTOMATICALLY CONTROLLING BIT-LINE RECOVERY OPERATION

BACKGROUND OF THE INVENTION

1. Field of the Invention

The present invention relates to a semiconductor memory device such as a SRAM (a Static Random Access Memory), and more particularly, it relates to bit line loads for bit lines in a SRAM, which is capable of accelerating a recovery operation.

2. Description of the Prior Art

FIG. 1 is a block diagram showing a memory core circuit in a conventional static random access memory (SRAM). In FIG. 1, each memory cell MC in a memory cell array 100 in the memory core circuit is placed at each cross point of a plurality of bit line pairs BL and bBL (BL0 and bBL0, BL1 and bBL1,) and a plurality of word lines WL (WL0, WL1, . . . ).

PMOS transistors QP1 and QP2 as bit line loads are connected to one end of each bit line pair BL and bBL. Other end of each bit line pair BL and bBL is connected to data line pair DL and bDL through each column gate 105 which is made up of NMOS transistors QN1 and QN2.

The data line pair DL and bDL is connected to a write-in driver 103 for data write-in operation, and also connected to a sense amplifier (SA) 102 for data readout operation.

FIG. 2 is a timing chart showing a data write operation and a write recovery operation in the conventional SRAM shown in FIG. 1.

When a data item is written into one memory cell MC, as shown in FIG. 2, the level of a write enable signal /WE is switched to a L level. One of the data line pair DL and bDL becomes the L level and other becomes a H level according to the value of the write-in data. These levels of the data line pairs DL and bDL are transferred to the bit line pair which are selected by the column gate 105. Further, the levels of the data line pair DL and bDL are written into the memory cell MC that is selected by a word line WL (WL0, WL1, . . . WLn). After the completion of the data write-in operation to the memory cell MC, the write enable signal /WE is switched to the H level, and a write recovery operation is performed. In the write recovery operation, the levels of both the bit lines BL and bBL in each bit line pair are set to the H level for the following data readout operation or the following data write-in operation. In the write recovery operation, the level of the precharge signal /PCH becomes the L level and the PMOS transistors QP and QP2 as the bit line loads enter an ON state (an active state).

Because both the capacity of the bit lines and the capacity of the data lines become large in large scale semiconductor integrated circuits, it is difficult to execute the write recovery operation at a high speed rate only by using the write-in driver 103. In order to avoid this conventional drawback, both the PMOS transistors QP1 and QP2 as the bit line loads in the conventional SRAM shown in FIG. 2 enter the ON state during the write recovery operation by setting the L level to the precharge signal /PCH. Thereby, the bit line pair BL and bBL can be charged rapidly.

During both the data write-in operation and the data readout operation, the level of this precharge signal is kept at the H level (namely, /PCH=H).

However, such a conventional control method of the bit line recovery operation which is performed in the DRAM having the configuration shown in FIG. 1, it must be necessary to adjust both the timing of the ON/OFF operation of the write-in driver 103 and the timing of the ON/OFF of the PMOS transistors QP1 and QP2 as the bit line loads for the bit lines BL and bBL. When both the timings are not matched to each other, it happens that a write-in data item changes to a wrong data item, or a waste power consumption increases. Furthermore, because the recovery operation for the bit lines by the PMOS transistors QP1 and QP2 is performed for all of the bit lines BL and bBL (BL0, bBL0, BL1, bBL1, . . . ) which are selected by the word lines, the large power consumption for the gate capacitances of the PMOS transistors QP1 and QP2 (as the bit line loads) increases.

SUMMARY OF THE INVENTION

Accordingly, an object of the present invention is, with due consideration to the drawbacks of the conventional semiconductor memory device, to provide a semiconductor memory device of a low power consumption with an improved timing margin which is capable of performing the recovery operation for the bit lines automatically only by the control of the write-in driver without any elapse of the timings between the ON/OFF operation of the PMOS transistors as the bit line loads and the ON/OFF operation of the write-in driver.

In accordance with a preferred embodiment of the present invention, a semiconductor memory device has a memory cell array, a write-in driver, a sense amplifier, and bit line loads. The memory cell array includes memory cells which are located at cross points of word lines and bit lines. The write-in driver performs data write-in operation to transfer write-in data to the memory cells through the bit lines, and performs a recovery operation by supplying a high level voltage to the bit lines when a voltage potential of the bit lines drops to a low voltage potential after a completion of the data write-in operation. The sense amplifier detects and amplifies data read from the memory cells through the bit lines. The operation of the bit line loads is controlled by the voltage potential of the bit lines. Each bit line load is placed between a first power source and each of the bit lines. The bit line load enters the ON state in order to accelerate the recovery operation when the voltage potential of the bit lines reach to a predetermined voltage potential during the recovery operation performed by the write-in driver. Thereby, the bit line loads for the bit lines are controlled automatically by the voltage potential of the bit lines and enters the ON state when the voltage potential of the bit lines is over a predetermined voltage level in order to accelerate the speed of the recovery operation. Accordingly, it is not necessary to match the timings between the write-in driver and the bit line loads. This feature of the present invention causes to increase a timing margin and to suppress the power consumption to be used for the control of the bit line loads.

In addition, in a semiconductor memory device as another preferred embodiment of the present invention, each of the bit line loads includes a PMOS transistor whose drain is connected to the corresponding bit line and whose source is connected to the first power source, and an inverter connected between the corresponding bit line and a gate of the PMOS transistor for inverting a voltage potential of the corresponding bit line and transferring the inverted voltage potential to the gate of the PMOS transistor. Thereby, during the recovery operation performed by the write-in driver, the PMOS transistor enters the ON state automatically when the voltage of the bit line, whose voltage potential has dropped to a low voltage potential, reaches to and over a threshold voltage of the PMOS transistor. The entering to the ON state of the PMOS transistor causes to increase the voltage potential of the bit lines rapidly to the H level. On the other hand, during a data write-in operation, because the PMOS transistor enters the OFF state when the voltage potential of the bit line to be shifted to the L level drops under a threshold voltage of the inverter, no waste current flows through the bit line and it is thereby possible to perform the data write-in operation at high speed.

Furthermore, in a semiconductor memory device as another preferred embodiment of the present invention, each of the bit line loads further includes a NMOS transistor connected to the PMOS transistor in series. In the semiconductor memory device, a drain of the NMOS transistor is connected to both the corresponding bit line and the drain of the PMOS transistor, and a source of the NMOS transistor is connected to a second power source, and a gate of the NMOS transistor is connected to the inverter in order to supply an output of the inverter. Thereby, each bit line load includes a flip flop as one inverter made up of the PMOS transistor and the NMOS transistor. In each bit line load, two inverters are connected in parallel and in reverse direction. In this configuration of each bit line load, the NMOS transistor enters the ON state which is connected to the bit line in the bit line pair whose voltage potential is shifted to the L level during the data write-in operation. This causes to accelerate the level shifting of the bit line to the L level. Therefore it is possible to perform the data write-in operation at high speed.

Moreover, in a semiconductor memory device as another preferred embodiment of the present invention, the inverter in each of the bit line loads has a type in which an amplitude of an output voltage is suppressed.

In addition, in a semiconductor memory device as another preferred embodiment of the present invention, the inverter in each of the bit line loads is a type in which an amplitude of an output voltage is suppressed.

Furthermore, in a semiconductor memory device as another preferred embodiment of the present invention, each of the bit line loads has a NMOS transistor whose drain is connected to a first power source, and whose source is connected to the corresponding bit line, a first inverter whose input is connected to the corresponding bit line, and a second inverter whose input is connected to an output of the first inverter and whose output is connected to a gate of the NMOS transistor.

In addition, in a semiconductor memory device as another preferred embodiment of the present invention, each of the memory cells is a SRAM cell, and the sense amplifier is a sense amplifier of a current amplifier type for detection a change of a current flow and amplifying the current flow.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 3:
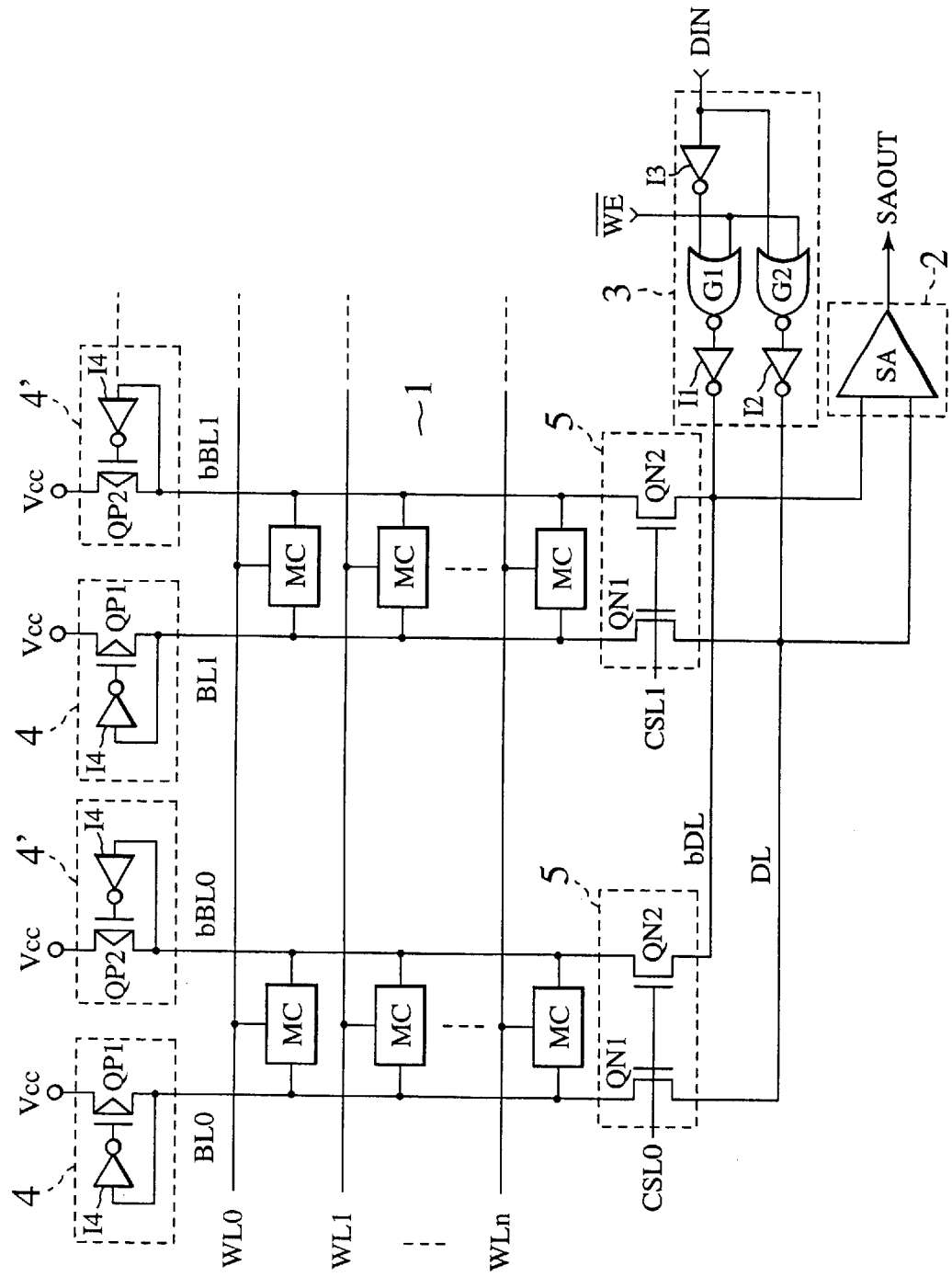
FIG. 3 is a block diagram showing a configuration of a core circuit of a SRAM as a semiconductor memory device according to the first embodiment of the present invention.

FIG. 3 is a block diagram showing a configuration of a SRAM as a semiconductor memory device according to the first embodiment of the present invention. In particularly, FIG. 3 shows a configuration of a memory core circuit of the SRAM. In FIG. 3, the reference number 1 designates a memory cell array in the memory core circuit of the SRAM. The reference character MC designates each memory cell to which a data item is written and then stored, and from which the data item is readout. The reference characters WL0, WL1, ..., and WLn indicate word lines. The reference characters BL and bBL denote each bit line pair (B10 and bBL0, BL1 and bBL1, ...).

The reference number 2 denotes a sense amplifier (SA) through which a data item stored in the memory cell MC is transferred to the outside of the memory core circuit. The reference number 3 indicates a write-in driver through which a data item is written into the memory cell MC through a bit line pair BL and bBL. This write-in driver is made up of an inverter I3, a NOR gate G1 and an inverter I1, and a NOR gate G2 and an inverter I2.

The reference number 4 designates a bit line load for a bit line BL (BL0, BL1, ...) in each bit line pair (BL and bBL). The reference number 4' designates a bit line load for a bit line bBL (bBL0, bBL1, ...) in each bit line pair (BL and bBL). Each of the bit line loads 4 and 4' is made up of a PMOS transistor and an inverter. For example, the bit line load 4 for the bit line BL0 in the bit line pair (BL0 and bBL0) is made up of a PMOS transistor QP1 and an inverter I4. Similarly, the bit line load 4' for the bit line bb10 in the bit line pair (BL0 and bBL0) is made up of a PMOS transistor QP2 and an inverter I4.

Figure 1:
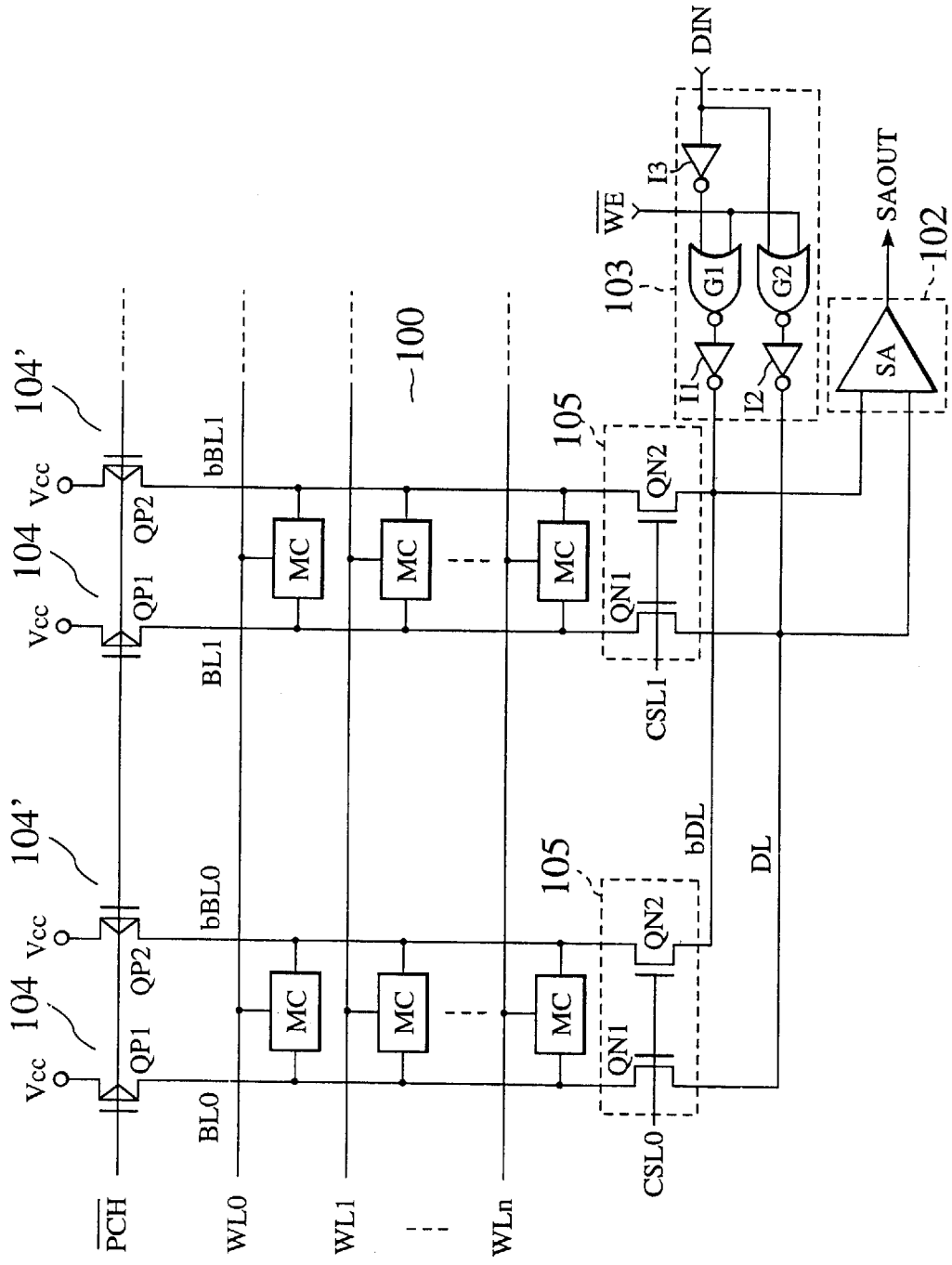
FIG. 1 is a diagram showing a configuration of a conventional SRAM.
Figure 2:
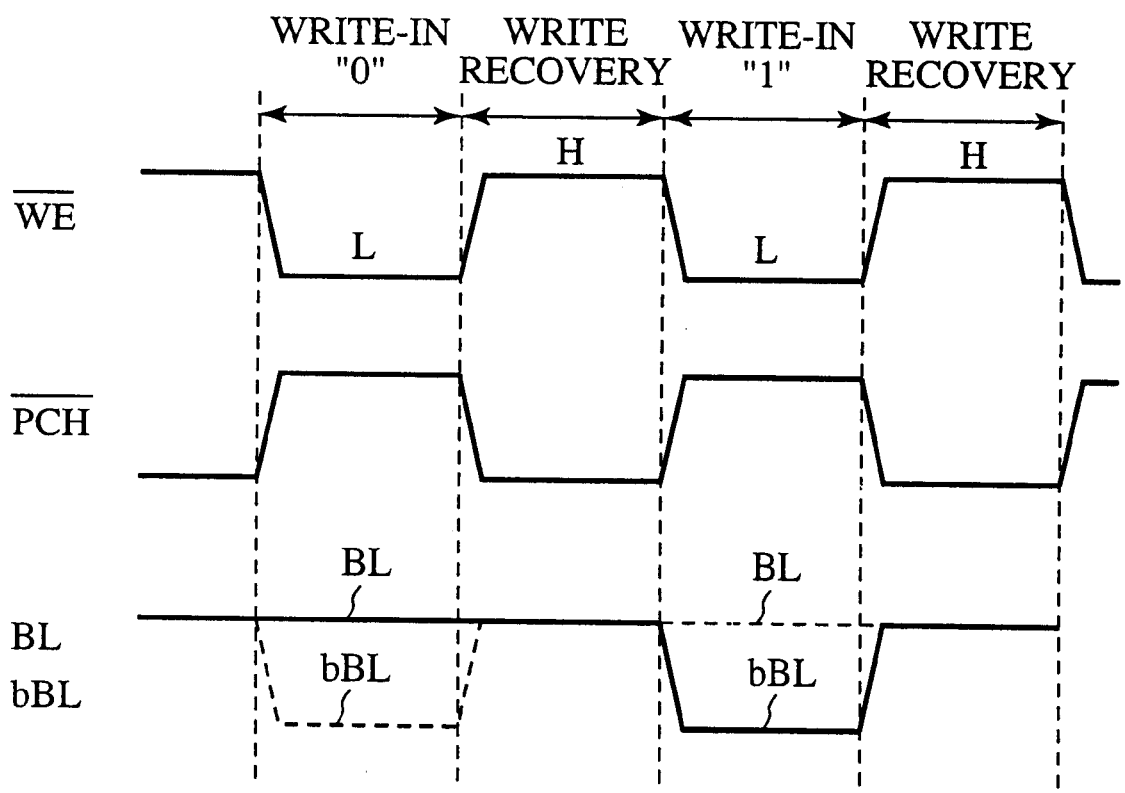
FIG. 2 is a timing chart of the operation of the conventional SRAM shown in FIG. 1.

The reference number 5 indicates a column gate which is placed for each bit line pair BL and bBL. In the configuration shown in FIG. 1, each memory cell MC is placed at each cross point between the word line WL (WL0, WL1, ..., and WLn) and bit line pairs BL and bBL (BL0 and bBL0, BL1 and bBL1, ...), and one end of the bit line pair BL and bBL is connected to the PMOS transistors QP1 and QP2 in the bit line loads 4 and 4', respectively. Other ends of which is connected to the data line pair DL and bDL through the corresponding column gate 5.

The data line pair DL and bDL is connected to the write-in driver 3 for data write-in operation, and also connected to the sense amplifier 2 for data readout operation.

A description will be given of the operation of the semiconductor memory device according to the first embodiment.

Figure 4:
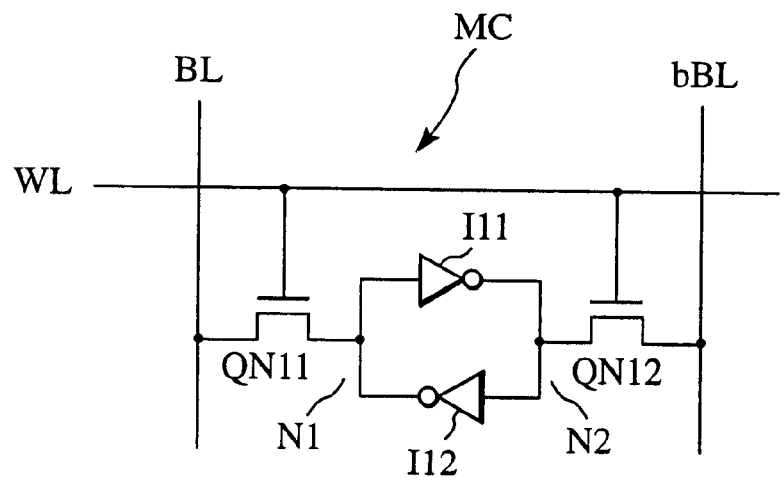
FIG. 4 is a block diagram showing a configuration of each memory cell in the SRAM.

FIG. 4 is a block diagram showing a configuration of each memory cell MC.

As shown in FIG. 4, each memory cell MC is a SRAM cell which comprises a flip flop in which inverters I11 and I12 are connected to each other. Nodes N1 and N2 are connected to the bit lines bBL and BL, respectively, in the bit line pair through NMOS transistors QN11 and QN12 as transfer gates, respectively. These NMOS transistors QN11 and QN12 are driven by the level of the word line WL.

In the configuration of the SRAM according to the first embodiment shown in FIG. 3, each of the bit line loads 4 and 4' comprises the PMOS transistor and the inverter, such as the PMOS transistor QP1 and the inverter I4, and the PMOS transistor QP2 and the inverter I4, for example. The sources of the PMOS transistors QP1 and QP2 are connected to the power source Vcc and the drains of which are connected to the bit lines BL and bBL, respectively. The inverter I4 inverts the level of the voltage potential of the corresponding bit line BL or bBL and provides the inverted one to the gate of the corresponding PMOS transistor. Accordingly, the bit line loads 4 and 4' have no control terminal for its operation to which a control signal is supplied from a control means (not shown). The ON/OFF operation of the PMOS transistor QP (QP1, QP2 . . . . ) in the bit line loads 4 and 4' is controlled automatically according to the voltage potential of each of the bit lines BL and bBL during the write recovery operation. The operation of the bit line loads 4 and 4' causes to increase the write recovery operation. This will be explained in detail.

The write-in driver 3 connected to both the data lines DL and bDL (DL0, bDL0, DL1, bDL1, . . . ) mainly comprises the NOR gates G1 and G2 whose operation is controlled by the write enable signal /WE.

The inverted data /DIN which is obtained through the inverter I3 and the write-in data DIN are supplied to the NOR gates G1 and G2, respectively. Accordingly, when the level of the write enable signal /WE is the L level, the data lines DL and bDL in the data line pair have opposite levels to each other according to the level (H level or L level) of the write-in data DIN. Thus, the complementary signals (for example, H level and L level, or L level and H level) are transferred to the bit lines BL and bBL in the bit line pair through the data lines DL and bDL.

It is preferred to use a sense amplifier of a current amplifier type having a rapidly amplifying function as the sense amplifier (SA) 2 which is connected to the data lines DL and bDL in the data line pair.

Figure 5:
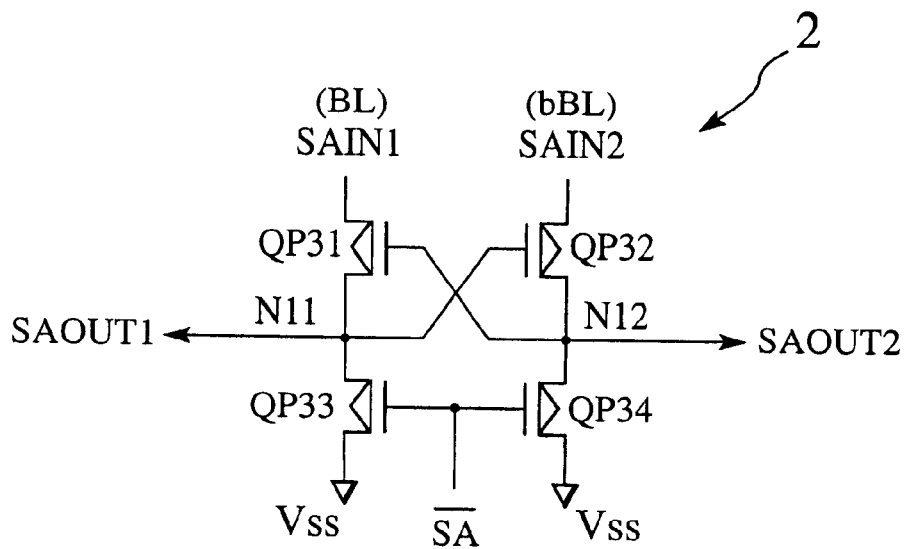
FIG. 5 is a block diagram showing a configuration of a sense amplifier in the SRAM.

FIG. 5 is a block diagram showing a practical configuration of the sense amplifier (SA) 2 as the current amplifier type. In FIG. 5, PMOS transistors QP31 and QP33 are connected in series between a sense input node SAIN1 connected to one bit line BL in the bit line pair and a ground source Vss. In addition, PMOS transistors QP32 and QP34 are connected in series between a sense input node SAIN2 connected to other bit line bBL and a ground source Vss. An activation signal /SA for the sense amplifier (SA) 2 is supplied to both the gates of the PMOS transistors QP33 and QP34. The gate of the PMOS transistor QP31 is connected to the connection node N12 through which the PMOS transistors QP32 and QP34 are connected to each other. Similar to this, the gate of the PMOS transistor QP32 is connected to the connection node N11 through which the PMOS transistors QP31 and QP33 are connected to each other. These connection nodes N11 and N12 become output nodes SAOUT1 and SAOUT2 of the sense amplifier (SA) 2.

In the sense amplifier (SA) 2 shown in FIG. 5, the difference of the currents supplied to the sense input nodes SAIN1 and SAIN2 according to a data item stored in a selected memory cell MC becomes the difference of the voltage potentials of the nodes N11 and N12. This voltage potential is feedback in positive direction to the PMOS transistors QP31 and QP32 in order to amplify the difference of the currents. Thereby, the outputs of the H level and the L level are transferred through the sense output nodes SAOUT1 and SAOUT2.

Figure 6:
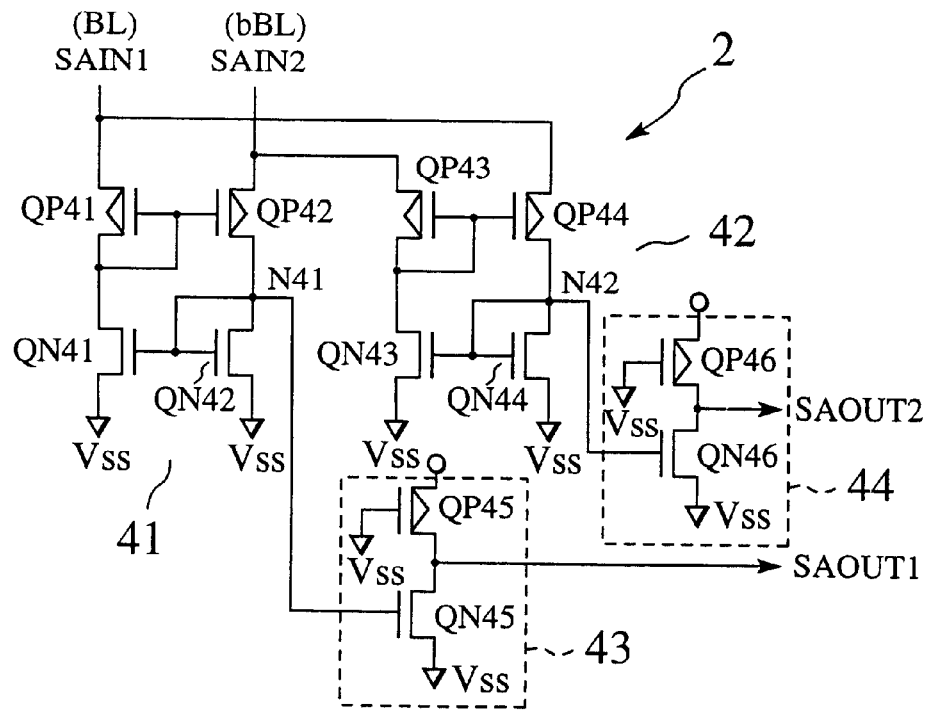
FIG. 6 is a circuit diagram showing another configuration of the sense amplifier in the SRAM.
Figure 7:
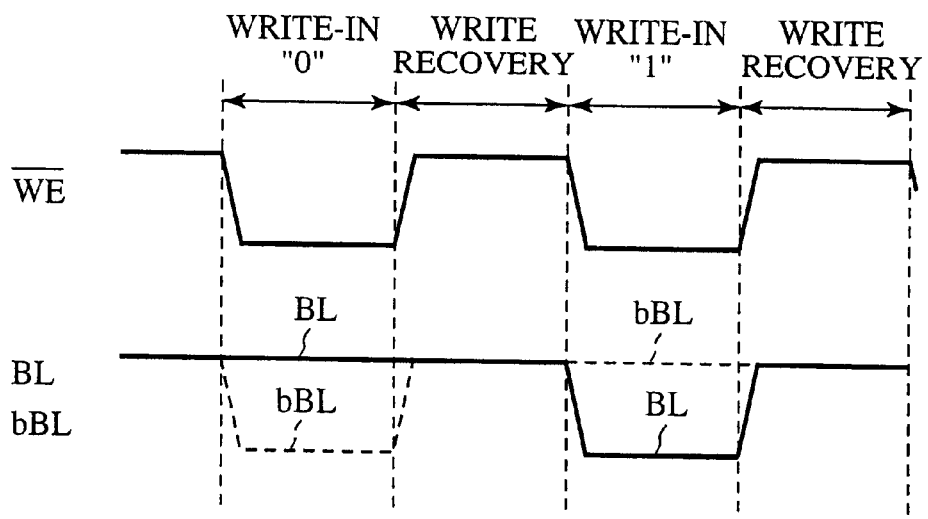
FIG. 7 is a timing chart of the operation of the SRAM shown in FIG. 3.

FIG. 6 is a circuit diagram showing another configuration of the sense amplifier (SA) 2 as the current amplifier type. In the configuration of the sense amplifier shown in FIG. 6, current detection circuits 41 and 42 which form two current detection systems are formed between the two sense input nodes SAIN1 and SAIN2 and the ground source Vss. In addition, inverters 43 and 44 are also placed in order to invert the level of the output from the current detection circuits 41 and 42. One current detection circuit 41 comprises PMOS transistors QP41 and QP42 which form a current mirror circuit, and NMOS transistors QN41 and QN42 which are placed between the drains of both the PMOS transistors QP41 and QP42 and the ground source Vss. Similar to this configuration, the current detection circuit 42 comprises PMOS transistors QP43 and QP43 which form a current mirror circuit, and NMOS transistors QN43 and QN44 which are placed between the drains of both the PMOS transistors QP43 and QP44 and the ground source Vss.

In the current detection circuit 41, both the gate and the drain of the PMOS transistor QP41 which are connected to the sense input node SAIN1 are connected to each other. On the contrary, in the current detection circuit 42, both the gate and the drain of the PMOS transistor QP43 which are connected to the sense input node SAIN2 are connected to each other.

In addition, both the gate and the drain of the NMOS transistor QN42 in the current detection circuit 41 are connected to each other, and both the gate and the drain of the NMOS transistor QN44 in the current detection circuit 42 are connected to each other.

In the sense amplifier circuit (SA) having the configuration shown in FIG. 6, when the magnitude of the input current to be supplied to the sense input node SAIN1 is large, the voltage between the source and the drain of the PMOS transistor QP42 becomes large and the voltage potential of the node N41 drops, because the POS transistor QP42 controls so that the current flowing through the PMOS transistor QP41 also flows through the PMOS transistor QP42 itself. Thereby, a voltage potential of the node N41 drops.

On the contrary, when the magnitude of the input node to be supplied to the sense input node SAIN2, the voltage potential of the node N42 drops. The change of the voltage potential at each of the nodes N41 and N42 becomes the change of the voltage potential of the drain in each of the NMOS transistors QP41 and QP43, and then feedback to the PMOS transistors QP42 and QP44. As a result, one of the nodes N41 and N42 becomes the H level, and other becomes the L level according to the input data item. These levels are inverted by the inverters 43 and 44 and then output to the outside.

Next, a description will be given of the data write-in operation and the data recovery operation in the SRAM as the first embodiment.

When the level of the write enable signal /WE becomes the L level, the write-in driver 3 outputs the H level to one data line DL (or bDL) and the L level of the other data line bDL (or DL) according to the level of the write-in data item DIN. These complementary signals, the H level and the L level are transferred to the bit line pair including the bit lines BL and bBL selected by the corresponding column selector 5, and then written into the memory cell MC selected by the word lines WL (WL0, WL1, ..., WLn). These write-in operation is the same as that of the conventional semiconductor memory device.

In the data write-in operation described above, when the H level is transferred to the bit line BL and the L level is supplied to the other bit line bBL in the bit line pair, the PMOS transistor QP1 connected to the bit line BL in the bit line load keeps the ON state (the active state), so that the level of the bit line BL is kept at the H level. Then, the voltage potential of the other bit line bBL drops toward the L level from the H level. When the level of the bit line bBL is lower than that of a threshold voltage of the inverter 14, the inverter 14 outputs the H level to the gate of the PMOS transistor QP2 in the bit line load 4'. Thereby, the PMOS transistor QP2 enters the OFF state. That is, the level of the bit line bBL drops approximately to the ground voltage Vss, because there is no current supply from the current source load 4 to the bit line bBL.

The write recovery operation can be performed by switching in level the write-in signal (/WE) to the H level. At this time, both the invertors I1 and I2 in the write-in driver 3 output the H level, because the write-in signal (/WE) has been switched to the H level. The H level of the data lines DL and bDL are transferred to the bit lines BL and bBL in each bit line pair. The voltage potential of the bit line bBL at the L level side increases by the output from the write-in driver 3. When the level of the bit line bBL is over the threshold voltage of the inverter I4 corresponding to the bit line bBL, the PMOS transistor QP2 enters the ON state. After this, the current is supplied from the power source voltage Vcc to the bit line bBL through the PMOS transistor QP2. This increase in speed the write recovery operation. That is, the write recovery operation in the SRAM according to the first embodiment is executed by the combination of the write-in driver 3 and the current source load 4 shown in FIG. 1. Even if the column gate 5 is closed before the completion of the write recovery operation, the write recovery operation can be executed continuously by the PMOS transistor QP2 unless the level of the bit line bBL is over the threshold voltage of the inverter I4.

As described above, according to the SRAM of the first embodiment, the timing of the write recovery operation is determined by the timing control of the write-in driver 3 automatically. Therefore it is not necessary to adjust the time elapse between both the timing of the control of the bit line loads 4 and 4' for the bit lines and the timing of the write-in driver 3. This feature provides a large timing margin in the write recovery operation in the SRAM. In addition, it is possible to reduce the total power consumption of the SRAM, because the bit line loads 4 and 4' for the bit lines whose level is changed to the L level during the data write-in operation and no waste current thereby flows.

On the other hand, levels of both the bit lines BL and bBL in each bit line pair are the H level at the initial state during the data readout operation, and the bit line loads 4 and 4' are in the ON state. However, when the sense amplifier of the current amplify type having the configuration shown in FIG. 5 or FIG. 6 is used as the sense amplifier, it is possible to execute certainly the data sensing operation without setting the bit line loads 4 and 4' to the OFF state. That is, it is possible to sense the bit lines BL and bBL in each bit line pair at a high speed without setting the bit line loads 4 and 4' to the OFF state by detecting and amplifying the difference of the currents flowing to the sense amplifier (SA) 2 through both the bit lines BL and bBL in the bit line pair from the bit line loads 4 and 4' according to the magnitude of the current which flows into the selected memory cell MC.

Second Embodiment

Figure 8:
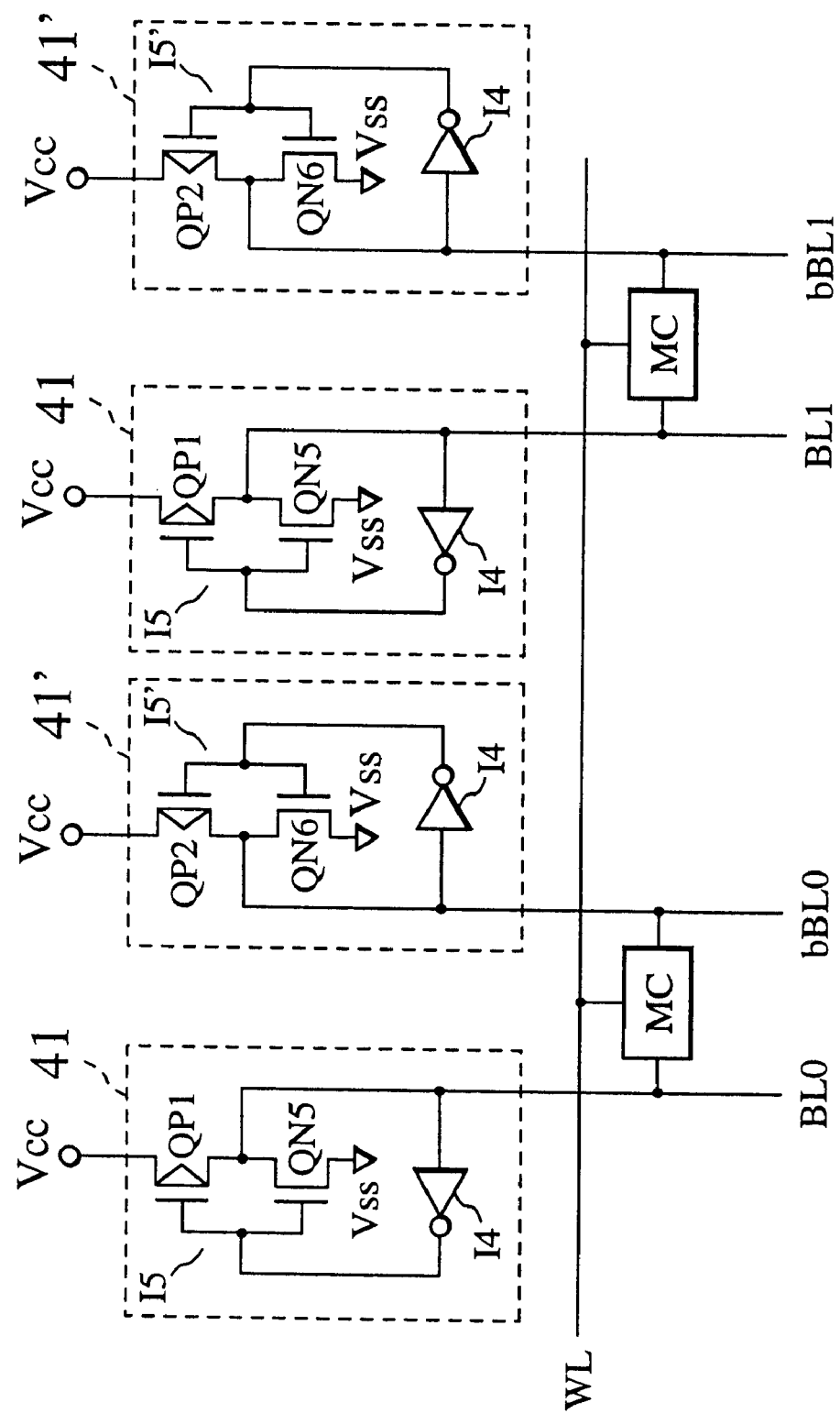
FIG. 8 is a circuit diagram showing mainly a configuration of each current source load for each pair of bit lines BL and bBL in a SRAM according to the second embodiment of the present invention.

FIG. 8 is a circuit diagram showing mainly a configuration of each bit line load for each pair of bit lines BL and bBL in a SRAM according to the second embodiment of the present invention. The reference number 41 designates each bit line load for each bit line BL (BL0, BL1, ...), and the reference number 41' denotes each bit line load for each bit line bBL (bBL0, bBL1, ...) in the SRAM of the second embodiment.

The bit line load 41 is made up of the inverter I4 and an inverter I5. The inverter I5 is made up of a PMOS transistor QP1 and a NMOS transistor QN5. The bit line load 41' is made up of the inverter I4 and an inverter I5'. The inverter I5' is made up of a PMOS transistor QP2 and a NMOS transistor QN6.

Next, a description will be given of the operation of the SRAM according to the second embodiment.

The bit line load 41 for the bit line BL (BL0, BL1, ...) includes the NMOS transistor QN5 in addition to the configuration of the bit line load 4 shown in FIG. 3. Similarly, the bit line load 41' for the bit line bBL (bBL0, bBL1, ...) includes the NMOS transistor QN6 in addition to the configuration of the bit line load 4' shown in FIG. 3.

The drains of the NMOS transistors QN5 and QN6 are connected to the bit line BL and the bit line bBL in each bit line pair, respectively. The sources of the NMOS transistors QN5 and QN6 are connected to the ground voltage Vss. The output of the inverter I4 is supplied to the gates of the NMOS transistors QN5 and QN6, and the PMOS transistors QP1 and QP2.

In the bit line loads 4 and 4' in the SRAM according to the second embodiment, the PMOS transistor QP1 and NMOS transistor QN5 forms the inverter I5, and the PMOS transistor QP2 and NMOS transistor QN6 forms the inverter I5'.

The inverter I5 (made up of the PMPS transistor QP1 and the NMOS transistor QN5) and the inverter I4 are connected to each other, and the inverter I5' (made up of the PMPS transistor QP2 and the NMOS transistor QN6) and the inverter I4 are also connected to each other. This configuration forms a flip flop.

The operation of the bit line loads 41 and 41' in the SRAM of the second embodiment is basically the same as that of the SRAM according to the first embodiment. The difference between the first embodiment and the second embodiment is as follows:

In the bit line loads 41 and 41', when the voltage potential of the bit line which is changed to the L level during the data write-in operation is not more than the threshold voltage of the inverter I4, the NMOS transistor QN5 or QN6 enters the ON state. That is, because the speed of the voltage transition of the bit line to the L level can be accelerated, it is possible to execute the data write-in operation at a high speed rate. Therefore the SRAM as the semiconductor memory device of the second embodiment is capable of performing the write-in operation at high speed in addition to the effect of the SRAM of the first embodiment.

Third Embodiment

Figure 9:
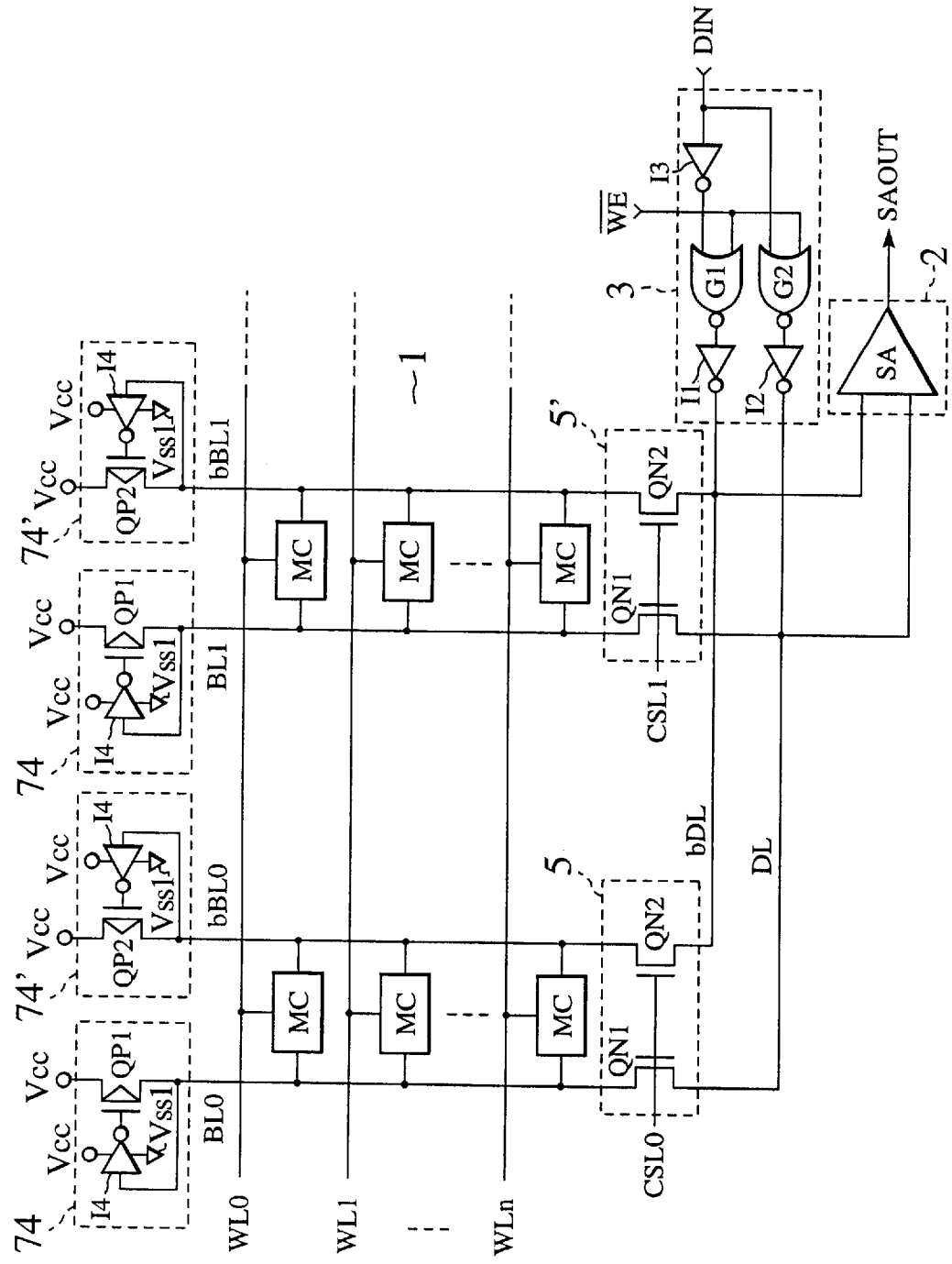
FIG. 9 is a block diagram showing a core circuit of a configuration of a SRAM according to the third embodiment of the present invention.

FIG. 9 is a block diagram showing a configuration of a memory core circuit in a SRAM according to the third embodiment of the present invention. In FIG. 9, the reference number 74 designates a bit line load for a bit line BL (BL0, BL1, . . . ) in each bit line pair (B1 and bBL). The reference number 74' designates a bit line load for a bit line bBL (bB10, bBL1, . . . ) in the bit line pair. Each of the bit line loads 74 and 74' is the same in configuration as that of each of the bit line loads 4 and 4' shown in FIG. 3, respectively.

The inverter I4 in the bit line loads 4 and 4' in the SRAM shown in FIG. 3 has a voltage amplitude (Vcc-Vss) of the power source voltage potential Vcc to the ground source voltage potential Vss. On the contrary, a positive voltage Vss1 in the bit line loads 74 and 74' in the SRAM of the third embodiment shown in FIG. 9 is slightly higher than that of the voltage Vss of the ground source. Other configuration components in the SRAM of the third embodiment are the same as those in the SRAM of the first embodiment shown in FIG. 3.

Next, a description will be given of the operation of the SRAM according to the third embodiment.

The configuration of the bit line loads 74 and 74' can improve the higher data readout operation. That is, during the data readout operation, the memory cell MC inputs the current from one of the bit lines BL and bBL according to the level of the data to be read out, and inputs no current from other bit line. At this time, the current which flows into the activated sense amplifier (SA) 2 from the PMOS transistor QP1 and QP2 in the bit line loads 74 and 74' through the bit lines BL and bBL in the bit line pair becomes i and (i–(i cell)) at the node in the bit lines BL and bBL in the bit line pair, respectively, where the input current to the memory cell MC is (i cell) only when the bit line loads 74 and 74' are current sources to flow the constant current i.

In a practical case, the amount of the cell current (i cell) that flows through the PMOS transistor QP1 in the bit line load 74 is increased by Δi. That is, because a bias between the gate and the source of the PMOS transistor QP1 is a constant, the amount of the current Δi can be increased by increasing the voltage |Vds| between the drain and the source. As a result, the currents flowing to the sense amplifier (SA) 2 are i and (i+Δi–(i cell)). Therefore the current difference i–(i+Δi–(i cell)) is smaller than that in an ideal current source load.

On the contrary, the gate voltage to enter both the PMOS transistors QP1 and QP2 into the ON state is the positive voltage Vss1 in the SRAM according to the third embodiment. That is, these PMOS transistors QP1 and QP2 in the ON state act a pentode=s operation in a small area of the voltage |Vgs| of the gate and the source.

As a result, it is possible to suppress the increasing Δi of the current caused by the PMOS transistor QP1 when the cell current (i cell) flows through the PMOS transistor QP1. This can keep a large difference between the currents flowing from the bit line pair (BL and bBL) to the sense amplifier (SA) 2. As a result, it is possible to read out a data item from a memory cell MC at a high speed rate.

In addition, it is possible to use the voltage Vss1, as the low level power source for the inverter I4 in the bit line loads 41 and 41' shown in FIG. 8, which is higher than that of the ground voltage Vss.

Fourth Embodiment

Figure 10:
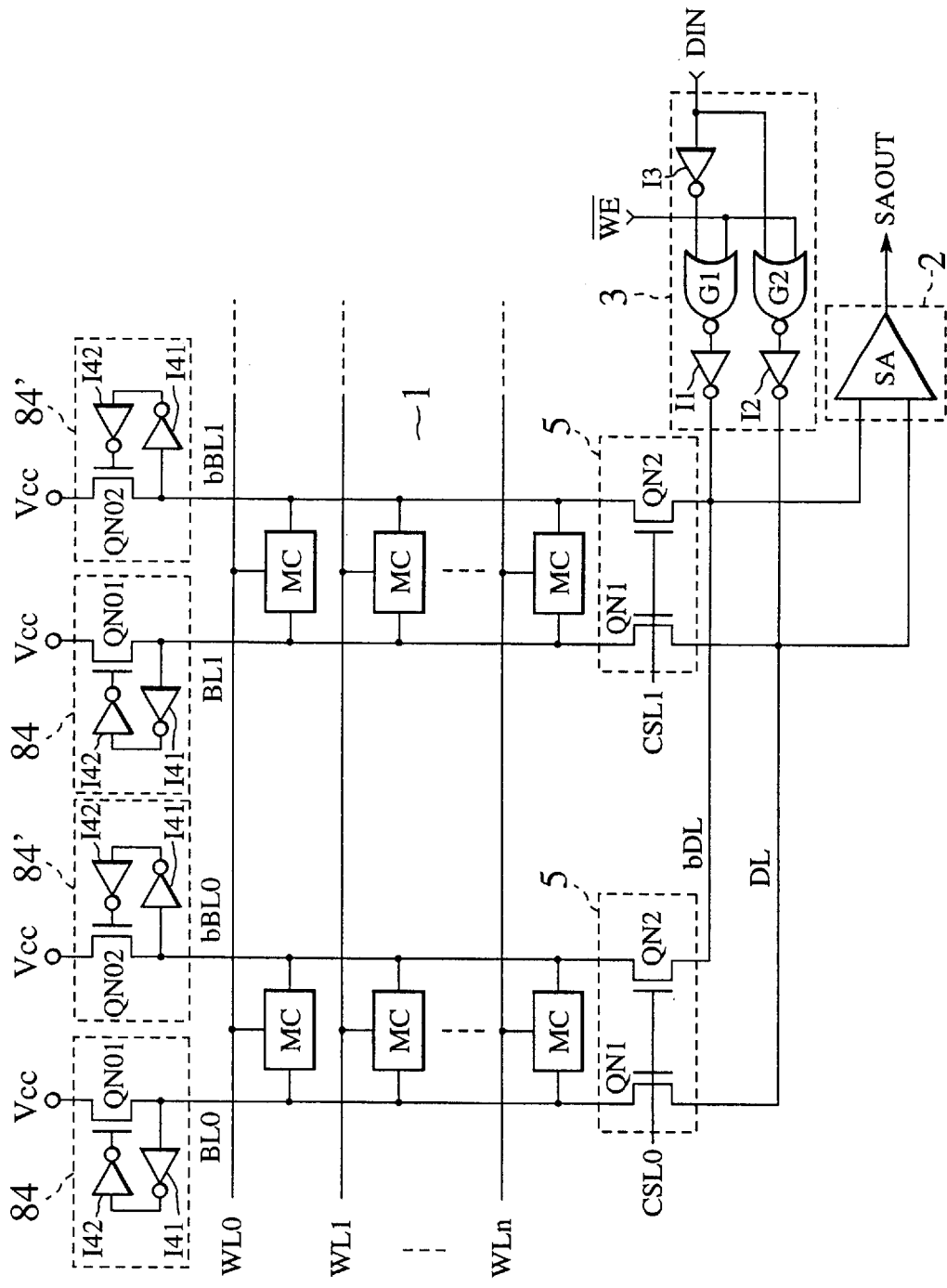
FIG. 10 is a block diagram showing a configuration of a core circuit of a SRAM according to the fourth embodiment of the present invention.

FIG. 10 is a block diagram showing a configuration of a memory score circuit of a SRAM according to the fourth embodiment of the present invention. In FIG. 10, the reference number 84 designates a bit line load for the bit line BL (BL0, BL1, . . . ) in each bit line pair. The bit line load 84 is made up of a NMOS transistor QN01, an inverter I41, and an inverter I42. The NMOS transistor QN01 is connected to the power source voltage Vcc, and the source of which is connected to the bit line BL (BL0, BL1, . . . ). The gate of the NMOS transistor QN01 is connected to the inverters I41 and I42 which are connected in series. The input side of the inverter I41 is connected to the bit line BL (BL0, BL1, . . . ).

The reference number 84' designates a bit line load for the bit line bBL (bBL0, bBL1, . . . ) in each bit line pair. The bit line load 84' is made up of a NMOS transistor QN02, the inverter I41, and the inverter I42. The NMOS transistor QN02 is connected to the power source voltage Vcc, and the source of which is connected to the bit line bBL (bBL0, bBL1 . . . ) The gate of the NMOS transistor QN02 is connected to the inverters I41 and I42 which are connected in series. The input side of the inverter I41 is connected to the bit line bBL (bBL0, bBL1, . . . ).

Other configuration components in the SRAM of the fourth embodiment shown in FIG. 10 are the same as those in the SRAM of the first embodiment shown in FIG. 3.

Next, a description will be given of the operation of the SRAM according to the fourth embodiment is as follows.

The NMOS transistor QN01 is driven through the gate thereof. The gate of the NMOS transistor QN1 is connected to the bit line BL (BL10, BL1, . . . ) through the two inverters I41 and I42 connected in series. The voltage potential of the bit line BL (B10, BL1, . . . ) is transferred to the gate of the NMOS transistor QN01 through the two inverters I41 and I42 connected in series.

Similarly, the NMOS transistor QN02 is driven through the gate thereof. The gate of the NMOS transistor QN2 is connected to the bit line bBL (bBL0, bBL1 . . . ) through the two inverters I41 and I42 connected in series. The voltage potential of the bit line bBL (bBL0, bBL1, . . . ) is transferred to the gate of the NMOS transistor QN02 through the two inverters I41 and I42 connected in series.

Thus, according to the configuration shown in FIG. 10, it is also possible to perform the write recovery operation automatically after the completion of the data write-in operation based on the same principle of the first embodiment. However, the charged level of each of the bit lines BL and bBL is limited by the threshold voltage of the NMOS transistors QN01 and QN02 in the bit line loads 84 and 84'.

Although the above descriptions, the SRAM is used as the semiconductor memory, the present invention is not limited by these configuration described above. For example, the concept of the present invention can be applied to various semiconductor memories which are incorporate memory cells to store data based on the presence of a current through bit lines, such as a nonvolatile semiconductor memory device.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor memory device comprising:
   a memory cell array having memory cells which are located at cross points of word lines and bit lines;
   a write-in driver for performing data write-in operation to transfer write-in data to said memory cells through said bit lines, and for performing a recovery operation by supplying a high level voltage to said bit lines when a voltage potential of said bit lines drops to a low voltage potential after a completion of said data write-in operation;

a sense amplifier for detecting and amplifying data read from said memory cells through said bit lines; and bit line loads whose operation being controlled by voltage potential of said bit lines, each bit line load being placed between a first power source and each of said bit lines, and said bit line load entering an ON state in order to accelerate said recovery operation when said voltage potential of said bit lines reach to a predetermined voltage potential during said recovery operation performed by said write-in driver.

2. The semiconductor memory device as claimed in claim 1, wherein each of said bit line loads comprises:

a PMOS transistor whose drain is connected to said corresponding bit line and whose source is connected to said first power source; and an inverter connected between said corresponding bit line and a gate of said PMOS transistor for inverting a voltage potential of said corresponding bit line and transferring said inverted voltage potential to said gate of said PMOS transistor.

3. The semiconductor memory device as claimed in claim 2, wherein each of said bit memory is a SRAM cell, and said sense amplifier is a sense amplifier of a current amplifier type for detecting a change of a current flow and amplifying said current flow.

4. The semiconductor memory device as claimed in claim 2, each of said bit line loads further comprises a NMOS transistor connected to said PMOS transistor in series, wherein a drain of said NMOS transistor is connected to both said corresponding bit line and said drain of said PMOS transistor, and a source of said NMOS transistor is connected to a second power source, and a gate of said NMOS transistor is connected to said inverter in order to supply an output of said inverter.

5. The semiconductor memory device as claimed in claim 4, said inverter in each of said bit line loads is a type in which an amplitude of an output voltage is suppressed.

6. The semiconductor memory device as claimed in claim 5, wherein each of said memory cells is a SRAM cell, and said sense amplifier is a sense amplifier of a current amplifier type for detecting a change of a current flow and amplifying said current flow.

7. The semiconductor memory device as claimed in claim 4, wherein each of said memory cells is a SRAM cell, and said sense amplifier is a sense amplifier of a current amplifier type for detecting a change of a current flow and amplifying said current flow.

8. The semiconductor memory device as claimed in claim 2, said inverter in each of said bit line has a type in which an amplitude of an output voltage is suppressed.

9. The semiconductor memory device as claimed in claim 8, wherein each of said memory cells is a SRAM cell, and said sense amplifier is a sense amplifier of a current amplifier type for detecting a change of a current flow and amplifying said current flow.

10. The semiconductor memory device as claimed in claim 1, wherein each of said bit line loads comprises:

a NMOS transistor whose drain is connected to a first power source, and whose source is connected to said corresponding bit line;

a first inverter whose input is connected to said corresponding bit line; and a second inverter whose input is connected to an output of said first inverter and whose output is connected to a gate of said NMOS transistor.

11. The semiconductor memory device as claimed in claim 1, wherein each of said memory cells is a SRAM cell, and said sense amplifier is a sense amplifier of a current amplifier type for detection a change of a current flow and amplifying said current flow.

12. The semiconductor memory device as claimed in claim 10, wherein each of said memory cells is a SRAM cell, and said sense amplifier is a sense amplifier of a current amplifier type for detecting a change of a current flow and amplifying said current flow.

* * * * *

UNITED STATES PATENT AND TRADEMARK OFFICE
CERTIFICATE OF CORRECTION

PATENT NO. : 6,366,492 B1
DATED : April 2, 2002
INVENTOR(S) : Kawasumi

It is certified that error appears in the above-identified patent and that said Letters Patent is hereby corrected as shown below:

Title page,
Item [*] Notice, delete the phrase "by 0 days" and insert -- by 212 days --

Signed and Sealed this

Twelfth Day of October, 2004

JON W. DUDAS
*Director of the United States Patent and Trademark Office*